(12) United States Patent
Zhang et al.

(10) Patent No.: US 10,183,860 B2
(45) Date of Patent: Jan. 22, 2019

(54) METHOD TO PACKAGE MULTIPLE MEMS SENSORS AND ACTUATORS AT DIFFERENT GASES AND CAVITY PRESSURES

(71) Applicant: mCube Inc., San Jose, CA (US)

(72) Inventors: Wenhua Zhang, San Jose, CA (US); Shingo Yoneoka, San Jose, CA (US)

(73) Assignee: mCube Inc., San Jose, CA (US)

( * ) Notice: Subject to any disclaimer, the term of this patent is extended or adjusted under 35 U.S.C. 154(b) by 54 days.

(21) Appl. No.: 14/887,622

(22) Filed: Oct. 20, 2015

(65) Prior Publication Data

US 2016/0039667 A1 Feb. 11, 2016

Related U.S. Application Data

(62) Division of application No. 14/102,465, filed on Dec. 10, 2013, now Pat. No. 9,174,838.

(60) Provisional application No. 61/735,553, filed on Dec. 10, 2012.

(51) Int. Cl.
| | |
|---|---|
| B81B 7/02 | (2006.01) |
| B81C 1/00 | (2006.01) |
| B81B 7/00 | (2006.01) |
| H01L 21/56 | (2006.01) |
| H01L 41/113 | (2006.01) |

(52) U.S. Cl.
CPC ............ B81B 7/02 (2013.01); B81B 7/0041 (2013.01); B81C 1/00293 (2013.01); B81C 1/00333 (2013.01); H01L 21/56 (2013.01); B81B 2201/0235 (2013.01); B81B 2201/0242 (2013.01); B81B 2201/0292 (2013.01); B81C 2203/0109 (2013.01); B81C 2203/0145 (2013.01); B81C 2203/0154 (2013.01); H01L 41/1132 (2013.01)

(58) Field of Classification Search
CPC ........ B81C 1/00333; B81C 2203/0154; B81C 1/00277; B81C 1/00293
USPC ..................................... 438/48–55
See application file for complete search history.

(56) References Cited

U.S. PATENT DOCUMENTS

| | | |
|---|---|---|
| 9,174,838 B2 | 11/2015 | Zhang et al. |
| 2002/0051258 A1 | 5/2002 | Tamura |

(Continued)

OTHER PUBLICATIONS

Notice of Allowance for U.S. Appl. No. 14/102,465 dated Jul. 7, 2015 25 pages.

(Continued)

*Primary Examiner* — Yu-Hsi D Sun
(74) *Attorney, Agent, or Firm* — Kilpatrick Townsend and Stockton LLP

(57) ABSTRACT

A method for fabricating a multiple MEMS device includes providing a semiconductor substrate having a first and second MEMS device, and an encapsulation wafer with a first cavity and a second cavity, which includes at least one channel. The first MEMS is encapsulated within the first cavity and the second MEMS device is encapsulated within the second cavity. These devices is encapsulated within a first encapsulation environment at a first air pressure, and encapsulating the first MEMS device within the first cavity at the first air pressure. The second MEMS device within the second cavity is then subjected to a second encapsulating environment at a second air pressure via the channel of the second cavity.

20 Claims, 13 Drawing Sheets

(56) References Cited

U.S. PATENT DOCUMENTS

2003/0183916 A1* 10/2003 Heck ............... B81C 1/00293
257/684
2010/0028618 A1 2/2010 Gonska et al.
2012/0326248 A1 12/2012 Daneman et al.
2016/0039666 A1 2/2016 Zhang et al.

OTHER PUBLICATIONS

Non-Final Office Action for U.S. Appl. No. 14/102,465 dated Feb. 17, 2015 10 pages.
Non-Final Office Action received in U.S. Appl. No. 14/887,631, dated Sep. 2, 2016. 14 pages.
Notice of Allowance received in U.S. Appl. No. 14/887,631, dated Jul. 12, 2017. 9 pages.

* cited by examiner

METHOD TO PACKAGE MULTIPLE MEMS SENSORS AND ACTUATORS AT DIFFERENT GASES AND CAVITY PRESSURES

CROSS-REFERENCES TO RELATED APPLICATIONS

The present application is a divisional patent application of U.S. patent application Ser. No. 14/102,465, filed Dec. 10, 2013, which claims priority to U.S. Pat. App. No. 61/735,553, filed Dec. 10, 2012, both of which are incorporated by reference in their entirety herein for all purposes. This application is also related to concurrently filed U.S. patent application Ser. No. 14/887,631, now U.S. Pat. No. 9,725,304, titled "METHOD TO PACKAGE MULTIPLE MEMS SENSORS AND ACTUATORS AT DIFFERENT GASES AND CAVITY PRESSURES," whose content is incorporated by reference in their entirety herein for all purposes.

BACKGROUND OF THE INVENTION

The present invention relates generally to integrated electronic devices and systems. In particular, the present invention provides a method for packaging multiple micro-electro mechanical systems (MEMS) sensors and actuators. Merely by way of example, the MEMS devices can include an accelerometer, a gyroscope, a magnetic sensor, a pressure sensor, a microphone, a humidity sensor, a temperature sensor, a chemical sensor, a biosensor, an inertial sensor, and others. But it will be recognized that the invention has a much broader range of applicability.

Research and development in integrated microelectronics have continued to produce astounding progress in CMOS, magnetic field sensors, and MEMS. CMOS technology has become the predominant fabrication technology for integrated circuits (IC). In layman's terms, microelectronic ICs are the "brains" of an integrated device which provides decision-making capabilities, whereas MEMS, magnetic field sensors, and others, are the "eyes" and "arms" that provide the ability to sense and control the environment. Some examples of the widespread application of these technologies are the switches in radio frequency (RF) antenna systems, such as those in the iPhone™ device by Apple, Inc. of Cupertino, Calif., and the Blackberry™ phone by Research In Motion Limited of Waterloo, Ontario, Canada, and accelerometers in sensor-equipped game devices, such as those in the Wii™ controller manufactured by Nintendo Company Limited of Japan. Though they are not always easily identifiable, these technologies are becoming ever more prevalent in society every day.

Beyond consumer electronics, use of IC, magnetic field sensing, and MEMS technology has limitless applications through modular measurement devices such as accelerometers, angular rate sensors, transducers, actuators, and other sensors and devices. In conventional vehicles, accelerometers and angular rate sensors are used to deploy airbags and trigger dynamic stability control functions, respectively. Magnetic sensors are commonly used in compass systems, such as those used in aircrafts to determine heading, pitch and roll. MEMS gyroscopes can also be used for image stabilization systems in video and still cameras, and automatic steering systems in airplanes and torpedoes. Biological MEMS (Bio-MEMS) implement biosensors and chemical sensors for Lab-On-Chip applications, which integrate one or more laboratory functions on a single millimeter-sized chip only. Other applications include Internet and telephone networks, security and financial applications, health care and medical systems and the like. Magnetic sensors have also been used in applications requiring proximity switching, positioning, speed detection, current sensing and the like. As described previously, ICs, magnetic field sensors, and MEMS can be used to practically engage in various type of environmental interaction.

Although highly successful, ICs and in particular magnetic field sensors and MEMS still have limitations. Similar to IC development, magnetic sensor and MEMS development, which focuses on increasing performance, reducing size, and decreasing cost, continues to be challenging. Additionally, applications of magnetic sensors and MEMS often require increasingly complex microsystems that desire greater computational power. Unfortunately, such applications generally do not exist. These and other limitations of conventional magnetic sensors, MEMS, and ICs may be further described throughout the present specification and more particularly below.

From the above, it is seen that techniques for improving operation of integrated circuit devices, magnetic field sensors, and MEMS are highly desired.

BRIEF SUMMARY OF THE INVENTION

According to embodiments of the present invention, techniques generally related to integrated electronic devices and systems are provided. In particular, the present invention provides a method for packaging multiple MEMS sensors and actuators. Merely by way of example, the MEMS devices can include an accelerometer, a gyroscope, a magnetic sensor, a pressure sensor, a microphone, a humidity sensor, a temperature sensor, a chemical sensor, a biosensor, an inertial sensor, and others. But it will be recognized that the invention has a much broader range of applicability.

The performance of MEMS devices have been found to be highly dependent on their operation pressures. Different MEMS devices can have optimal operating pressures. For example, MEMS accelerometers may require a higher operating pressure to ensure their performance and reliability. At low pressures, a MEMS accelerometer could have non-ideal oscillations ("ringing") under a sudden change of input acceleration, which makes the output signal of the accelerometer unstable. This non-ideal oscillation can be suppressed by increasing the air pressure of the environment around the accelerometer with a sealing gas, which can increase the damping of the accelerometer. High cavity pressure can also help to reduce the impact force due to the collision of the accelerometer's proof mass with the motion stoppers by acting as a damper and reducing the collision velocity.

On the other hand, resonance based sensors, such as gyroscopes and magnetometers, may require low operating pressures to minimize the damping during their operations. These sensors have larger sensitivities and lower power consumption at lower operation pressures. Similarly, MEMS resonators, which are used for oscillators and filters, may require low pressure to minimize damping as well or to maximize their quality factors. MEMS oscillators for timing reference applications need high quality factors to reduce the impact of close-to-carrier phase noise. MEMS filters may also require high quality factors for high frequency sensitivity. MEMS based infrared sensors, such as micro-bolometers may also require low operating pressures to minimize the thermal conduction through the surrounding gas and to maximize their sensitivity.

Wafer-level packaging techniques have often been used to control and maintain the operating conditions of MEMS devices. Various embodiments of the present invention include using a silicon wafer with cavities as an encapsulation layer, which is bonded overlying a wafer with fabricated MEMS devices, sealing the cavities. The bonding methods can include eutectic bonding, glass-fit seal, and fusion bonding. The pressure within the cavities (operational pressure) is defined by the pressure during the sealing process. However, conventional wafer-level packaging processes only provide a single operating pressure across a wafer.

It is an object of the present invention to develop methods of fabricating integrated electronic devices that include different MEMS devices on one silicon chip or wafer. Integrating multiple MEMS devices on a single chip or wafer can reduce the die size and manufacturing costs. One of the difficulties of integrating different MEMS devices is the varying requirements of operational pressures, since conventional packaging methods cannot vary the sealing pressure from device to device. As seen from the above, it is an object of the present invention to develop a wafer-level packaging method that allows different devices, such as MEMS devices, to be sealed within different operation pressures on the same wafer or die.

In an embodiment, present invention includes a method for fabricating a multiple MEMS device including providing a semiconductor substrate having a first and second MEMS device, and an encapsulation wafer with a first cavity and a second cavity, which includes at least one channel. In a specific embodiment, the first MEMS device can be selected from a magnetometer, a gyroscope, accelerometer, an oscillator, a filter, an infrared sensor, and the like. The channel of the second cavity can have a depth that is less than the depth of the first and second cavities.

The first MEMS can be encapsulated within the first cavity and the second MEMS device can be encapsulated within the second cavity. These devices can be encapsulated within a provided first encapsulation environment at a first air pressure, encapsulating the first MEMS device within the first cavity at the first air pressure. In a specific embodiment, the first air pressure can be below atmospheric pressure or above atmospheric pressure. The first encapsulation environment can include gases such as helium, xenon, krypton, argon, and the like.

The second MEMS device within the second cavity can then be subjected to a provided second encapsulating environment at a second air pressure via the channel of the second cavity. In a specific embodiment, the first air pressure can be below the second air pressure. The channel can be sealed while within the second encapsulation environment, encapsulating the second MEMS device within the second cavity at the second air pressure. In a specific embodiment, the sealing of the channel can include depositing a layer of material using chemical vapor deposition (CVD), plasma vapor deposition (PVD), sputtering, evaporation, and the like.

In a specific embodiment, the present method can further include providing an initial encapsulation wafer and patterning a masking layer on top of the initial encapsulation wafer. The masking layer can include a first, second, and third opening. The width of the third opening can be substantially smaller than a width of either the first or second opening. The initial encapsulation wafer can be etched to form the encapsulation layer with the first cavity, second cavity, and channel being associated with the first opening, second opening, and third opening, respectively. Those of ordinary skills in the art will recognize other variations, modifications, and alternatives.

Many benefits are achieved by way of embodiments the present invention over conventional techniques. For example, embodiments of the present technique provide an easy to use process to integrate a multiple different MEMS devices on a single die. In some embodiments, the method provides higher device yields in dies per wafer with the integrated approach. Additionally, the method provides a process and system that are compatible with conventional semiconductor and MEMS process technologies without substantial modifications to conventional equipment and processes. Preferably, the invention provides for an improved multi-MEMS systems and related applications for a variety of uses. Depending upon the embodiment, one or more of these benefits may be achieved. These and other benefits will be described in more throughout the present specification and more particularly below.

Various additional objects, features and advantages of the present invention can be more fully appreciated with reference to the detailed description and accompanying drawings that follow.

BRIEF DESCRIPTION OF THE DRAWINGS

These diagrams are merely an example, which should not unduly limit the scope of the claims herein. One of ordinary skill in the art would recognize many other variations, modifications, and alternatives. It is also understood that the examples and embodiments described herein are for illustrative purposes only and that various modifications or changes in light thereof will be suggested to persons skilled in the art and are to be included within the spirit and purview of this process and scope of the appended claims.

DETAILED DESCRIPTION OF THE INVENTION

Figure 1:
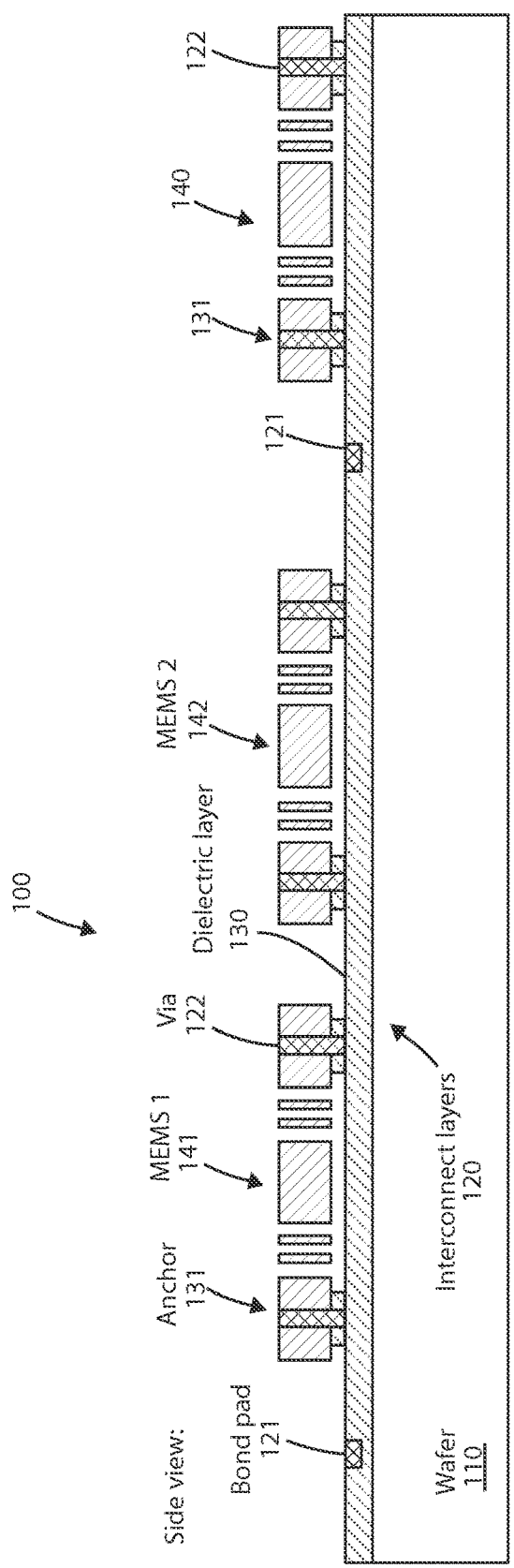
FIG. 1 illustrates a simplified cross-sectional diagram of a method step of providing a semiconductor substrate with MEMS devices according to an embodiment of the present invention.

According to embodiments of the present invention, techniques generally related to integrated electronic devices and systems are provided. In particular, the present invention provides a method for packaging multiple MEMS sensors and actuators. Merely by way of example, the MEMS devices can include an accelerometer, a gyroscope, a magnetic sensor, a pressure sensor, a microphone, a humidity sensor, a temperature sensor, a chemical sensor, a biosensor, an inertial sensor, and others. But it will be recognized that the invention has a much broader range of applicability.

The performance of MEMS devices have been found to be highly dependent on their operation pressures. Different MEMS devices can have optimal operating pressures. For example, MEMS accelerometers may require a higher operating pressure to ensure their performance and reliability. At low pressures, a MEMS accelerometer could have non-ideal oscillations ("ringing") under a sudden change of input acceleration, which makes the output signal of the accelerometer unstable. This non-ideal oscillation can be suppressed by increasing the air pressure of the environment around the accelerometer with a sealing gas, which can increase the damping of the accelerometer. High cavity pressure can also help to reduce the impact force due to the collision of the accelerometer's proof mass with the motion stoppers by acting as a damper and reducing the collision velocity.

On the other hand, resonance based sensors, such as gyroscopes and magnetometers, may require low operating pressures to minimize the damping during their operations. These sensors have larger sensitivities and lower power consumption at lower operation pressures. Similarly, MEMS resonators, which are used for oscillators and filters, may require low pressure to minimize damping as well or to maximize their quality factors. MEMS oscillators for timing reference applications need high quality factors to reduce the impact of close-to-carrier phase noise. MEMS filters may also require high quality factors for high frequency sensitivity. MEMS based infrared sensors, such as micro-bolometers may also require low operating pressures to minimize the thermal conduction through the surrounding gas and to maximize their sensitivity.

Wafer-level packaging techniques have often been used to control and maintain the operating conditions of MEMS devices. Various embodiments of the present invention include using a silicon wafer with cavities as an encapsulation layer, which is bonded overlying a wafer with fabricated MEMS devices, sealing the cavities. The bonding methods can include eutectic bonding, glass-fit seal, and fusion bonding. The pressure within the cavities (operational pressure) is defined by the pressure during the sealing process. However, conventional wafer-level packaging processes only provide a single operating pressure across a wafer.

It is an object of the present invention to develop methods of fabricating integrated electronic devices that include different MEMS devices on one silicon chip or wafer. Integrating multiple MEMS devices on a single chip or wafer can reduce the die size and manufacturing costs. One of the difficulties of integrating different MEMS devices is the varying requirements of operational pressures, since conventional packaging methods cannot vary the sealing pressure from device to device. As seen from the above, it is an object of the present invention to develop a wafer-level packaging method that allows different devices, such as MEMS devices, to be sealed within different operation pressures on the same wafer or die.

In an embodiment, present invention includes a method for fabricating a multiple MEMS device including providing a semiconductor substrate having a first and second MEMS device, and an encapsulation wafer with a first cavity and a second cavity, which includes at least one channel. In a specific embodiment, the first MEMS device can be selected from a magnetometer, a gyroscope, accelerometer, an oscillator, a filter, an infrared sensor, and the like. The channel of the second cavity can have a depth that is less than the depth of the first and second cavities.

The first MEMS can be encapsulated within the first cavity and the second MEMS device can be encapsulated within the second cavity. These devices can be encapsulated within a provided first encapsulation environment at a first air pressure, encapsulating the first MEMS device within the first cavity at the first air pressure. In a specific embodiment, the first air pressure can be below atmospheric pressure or above atmospheric pressure. The first encapsulation environment can include gases such as helium, xenon, krypton, argon, and the like.

The second MEMS device within the second cavity can then be subjected to a provided second encapsulating environment at a second air pressure via the channel of the second cavity. In a specific embodiment, the first air pressure can be below the second air pressure. The channel can be sealed while within the second encapsulation environment, encapsulating the second MEMS device within the second cavity at the second air pressure. In a specific embodiment, the sealing of the channel can include depositing a layer of material using chemical vapor deposition (CVD), plasma vapor deposition (PVD), sputtering, evaporation, and the like.

In a specific embodiment, the present method can further include providing an initial encapsulation wafer and patterning a masking layer on top of the initial encapsulation wafer. The masking layer can include a first, second, and third opening. The width of the third opening can be substantially smaller than a width of either the first or second opening. The initial encapsulation wafer can be etched to form the encapsulation layer with the first cavity, second cavity, and channel being associated with the first opening, second opening, and third opening, respectively. Those of ordinary skills in the art will recognize other variations, modifications, and alternatives.

Many benefits are achieved by way of embodiments the present invention over conventional techniques. For example, embodiments of the present technique provide an easy to use process to integrate a multiple different MEMS devices on a single die. In some embodiments, the method provides higher device yields in dies per wafer with the integrated approach. Additionally, the method provides a process and system that are compatible with conventional semiconductor and MEMS process technologies without substantial modifications to conventional equipment and processes. Preferably, the invention provides for an improved multi-MEMS systems and related applications for a variety of uses. Depending upon the embodiment, one or more of these benefits may be achieved. These and other benefits will be described in more throughout the present specification and more particularly below.

Various additional objects, features and advantages of the present invention can be more fully appreciated with reference to the detailed description and accompanying drawings that follow.

FIG. 1 illustrates a simplified cross-sectional diagram 100 of a method step of providing a semiconductor substrate with MEMS devices according to an embodiment of the present invention. As shown, the present method can include providing a semiconductor wafer 110 having multiple MEMS devices 140 and their electrical interconnects fabricated thereon using conventional surface or bulk micromachining process. Various components are shown, such as bond pads 121, anchors 131, via structures 122, and dielectric and interconnect layers 130, 120. In an embodiment, the multiple MEMS devices 140 can include a first and second MEMS device 141, 142. In a specific embodiment, the MEMS devices can be fabricated on a 10 micron thick silicon layer. The wafer may include materials such as quartz, silicon carbide, germanium, gallium arsenide, and the like.

Figure 2:
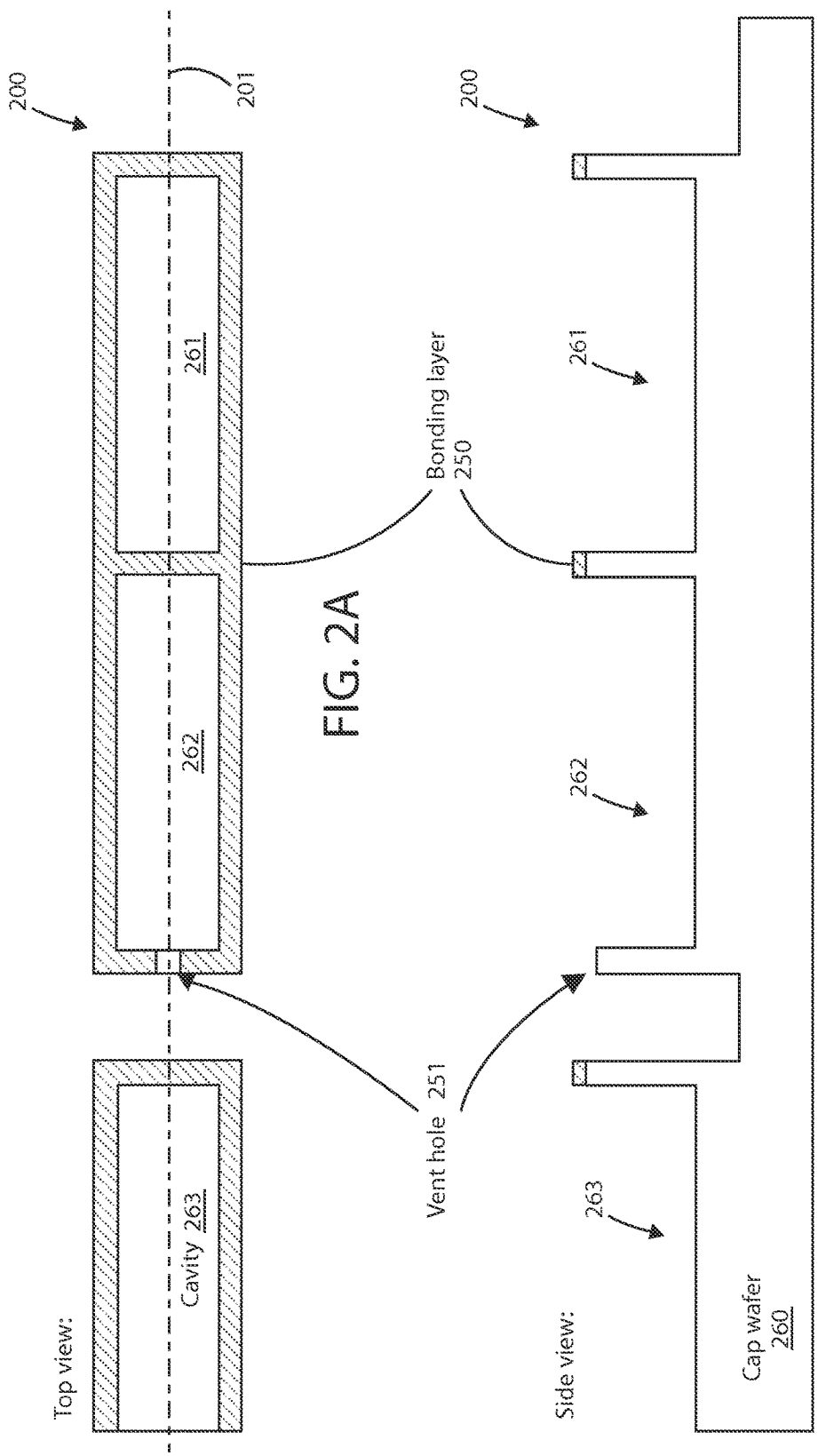
FIG. 2A illustrates a simplified top view diagram of a method step of providing an encapsulation wafer with cavities according to an embodiment of the present invention.
FIG. 2B illustrates a simplified cross-sectional diagram of a method step of providing an encapsulation wafer with cavities according to an embodiment of the present invention.

FIGS. 2A and 2B illustrate simplified diagrams 200 of a method step of providing an encapsulation wafer with cavities according to an embodiment of the present invention. A top view is shown in FIG. 2A and a cross-sectional view, based on a cut along plane 201 in FIG. 2A, is shown in FIG. 2B. In an embodiment, an encapsulation wafer 260 with one or more cavities can be provided 263. The one or more cavities can include a first and second cavity (261, 262), wherein the second cavity 262 includes at least one channel 251. A bonding layer 250 can be deposited for the wafer bonding process. Trenches or cavities with varying depths can be created by the combination of wet and dry etching processes. In a specific embodiment, the trenches can be fabricated with one etching process by using different etching rates in different etching areas. For example, the etching rate of deep reactive ion etching is slow at narrow regions. Therefore, one etching process can create trenches with varying depths by controlling the areas of the etching regions.

In various embodiments, deep etching loading effect creates a venting hole wherein the hole can be much shorter than the cavity so that the package can be easily sealed hermetically. Sealing processes can include film depositions of materials such as oxides, polysilicon, and the like. The advantage of this process is that no extra etching or drilling step is required to create a much shorter venting hole than the cavity, wherein the cavity is etched using the same deep etching process. In one embodiment, a feature size of the venting hole or channel is much smaller than the cavity. Accordingly, the deep etching process will etch the venting hole at a different rate with a different feature size compared to the cavity. Hence, this phenomenon is described herein as a loading effect of deep etching.

Figure 3:
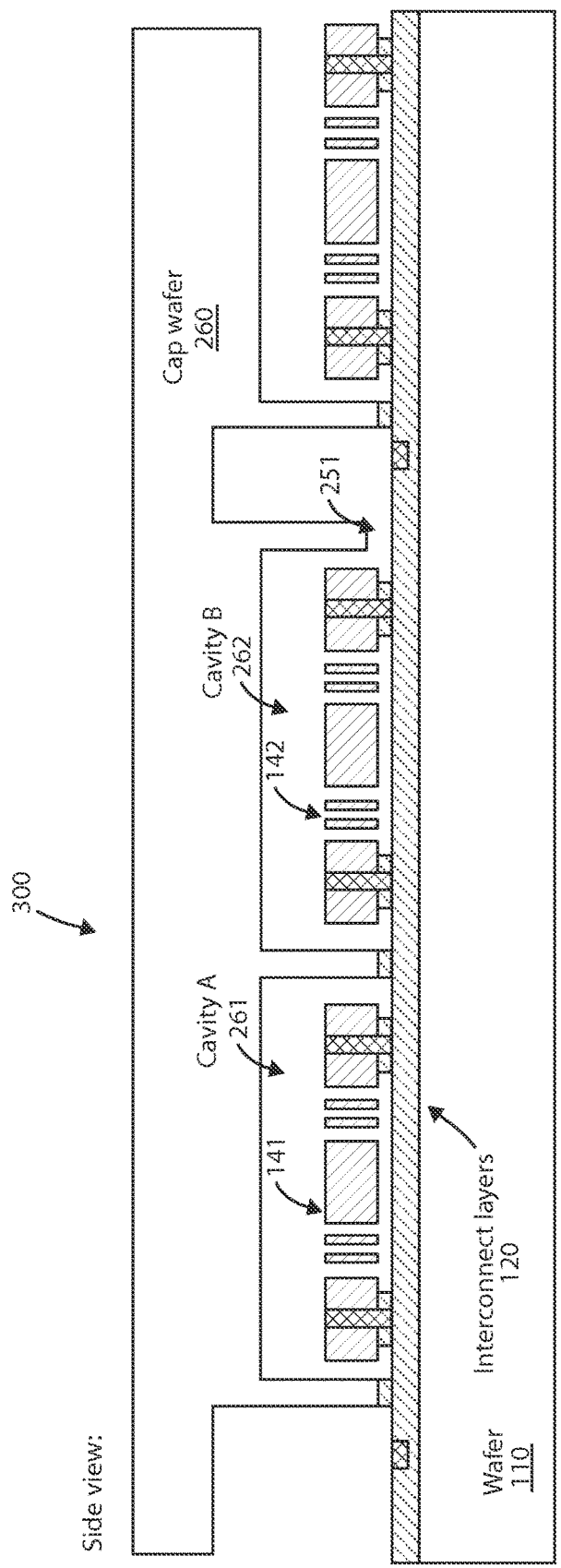
FIG. 3 illustrates a simplified cross-sectional diagram of a method step of encapsulating the MEMS devices within cavities according to an embodiment of the present invention.

FIG. 3 illustrates a simplified cross-sectional diagram 300 of a method step of encapsulating the MEMS devices within cavities according to an embodiment of the present invention. In an embodiment, the device shown can be the bonding of the wafer shown in FIG. 1 and the wafer shown in FIGS. 2A & 2B. FIG. 3 shows the bonding of the silicon wafer 110 with the MEMS devices 141, 142 and the cap wafer 260. The bonding methods can include fusion bonding, anodic bonding, metal layer bonding, eutectic bonding, thermo-compression bonding, glass frit bonding, and the like. The gas and pressure inside the MEMS cavity is determined by the process conditions of the bonding process. In an embodiment, the first and second MEMS 141, 142 can be encapsulated within the first and second cavities (261, 262), respectively. The first MEMS device 141 in the first cavity 261 would be encapsulated within a first encapsulation environment at a first air pressure.

Figure 4:
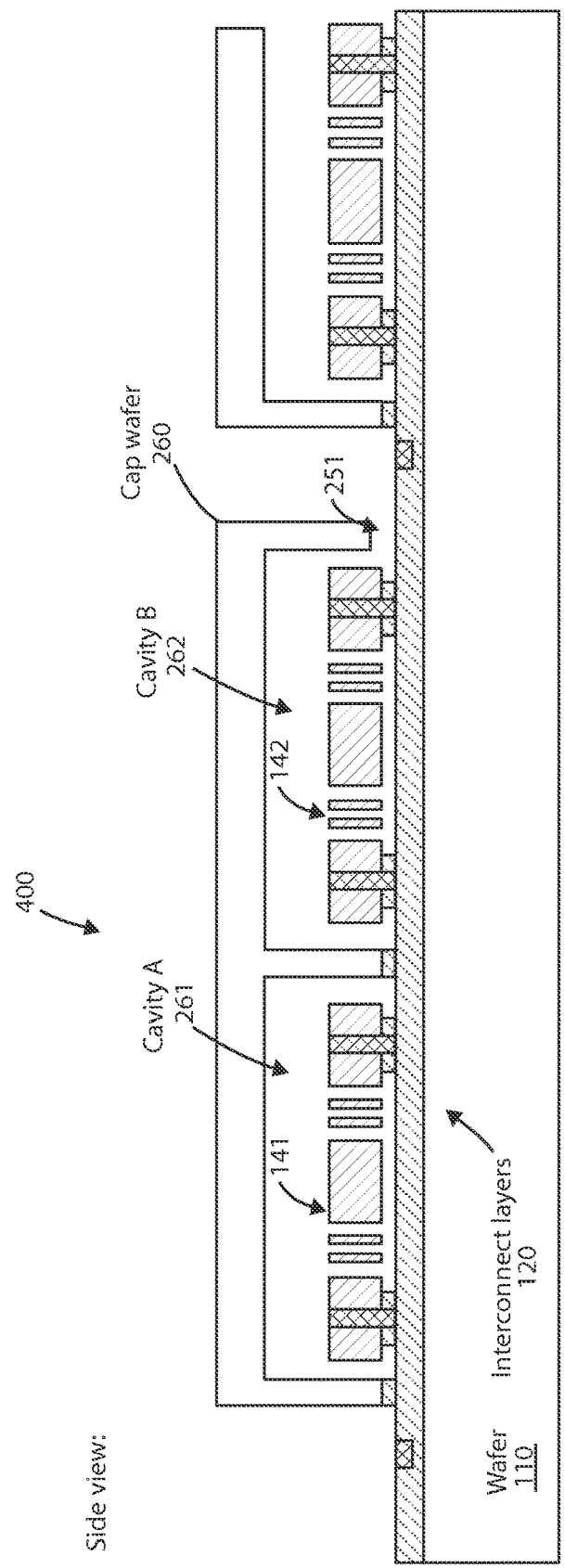
FIG. 4 illustrates a simplified cross-sectional diagram of a method step of etching the cap wafer to vent a cavity according to an embodiment of the present invention.

FIG. 4 illustrates a simplified cross-sectional diagram 400 of a method step of etching the cap wafer to vent a cavity according to an embodiment of the present invention. As shown, the cap wafer is etched from the top using any etching or grinding methods. In an embodiment, the cap wafer etching can be applied to the device shown previously in FIG. 3. While cavity A (261) maintains the sealing pressure of the previous wafer bonding process, the cavity B (262) is vented and has atmospheric pressure. In an embodiment, the second MEMS device 142 within the second cavity 262 can be subjected to a second encapsulation environment at a second air pressure via the channel or vent hole. In this case, the second air pressure is atmospheric pressure.

Figure 5:
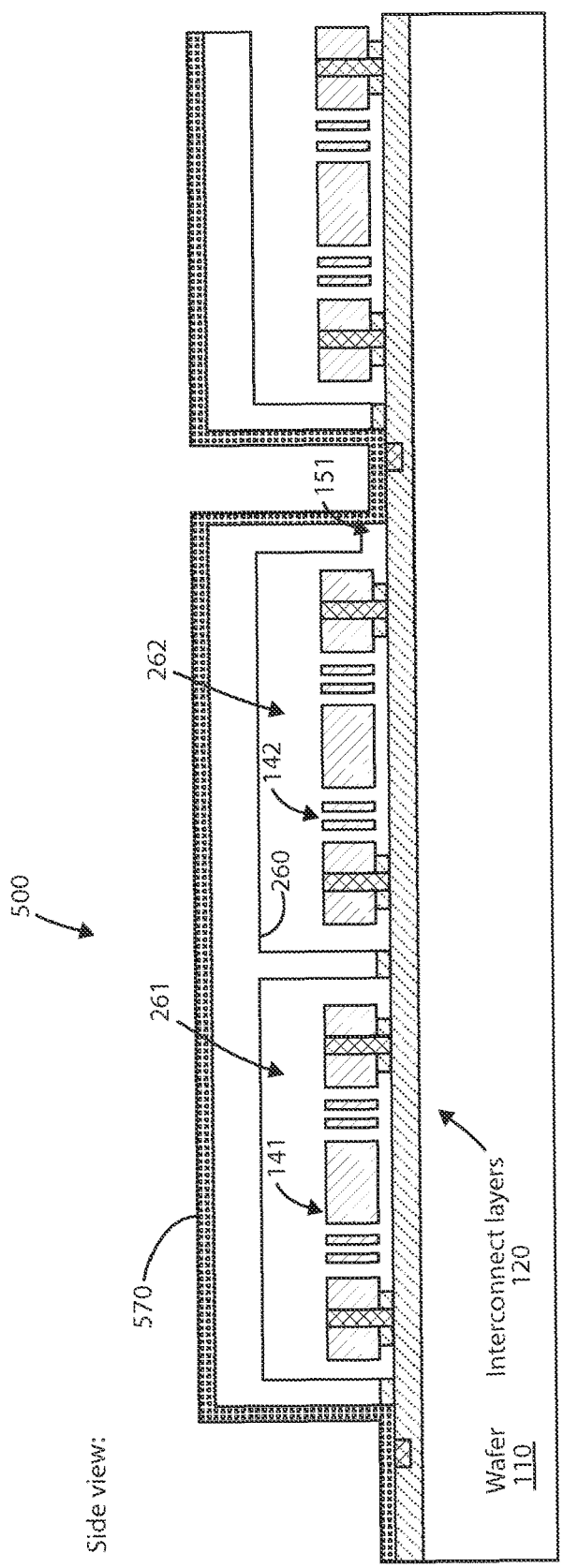
FIG. 5 illustrates a simplified cross-sectional diagram of a method step of depositing a thin film to seal a cavity according to an embodiment of the present invention.

FIG. 5 illustrates a simplified cross-sectional diagram 500 of a method step of depositing a thin film to seal a cavity according to an embodiment of the present invention. As shown, a thin film 570 is deposited on the bonded wafer using CVD, PCD, sputtering, evaporation, and the like. The thickness of the thin film 570 needs to be thick enough to seal the vent hole, or channel. The gas and pressure of cavity B is determined by the process pressure during the thin film deposition. In an embodiment, channel of the second cavity can be sealed to encapsulate the second MEMS device within the second cavity at the second air pressure.

Figure 6:
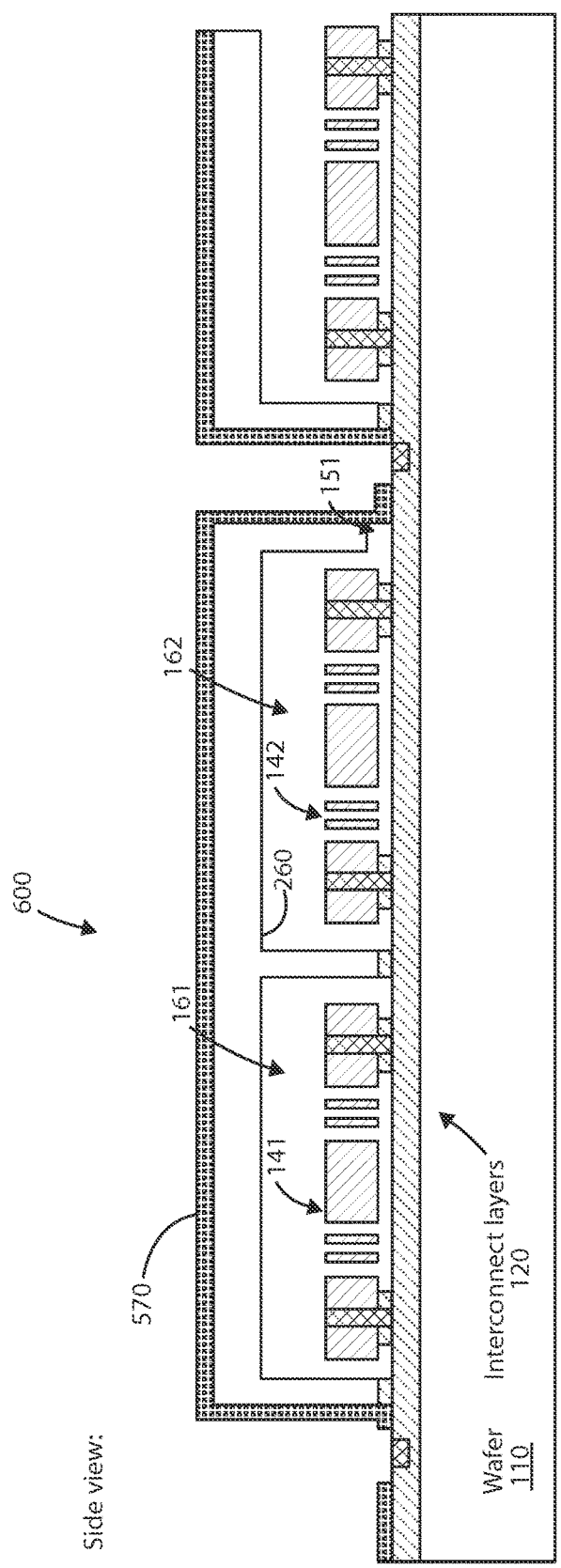
FIG. 6 illustrates a simplified cross-sectional diagram of a method step of opening bond pads according to an embodiment of the present invention.
Figure 7:
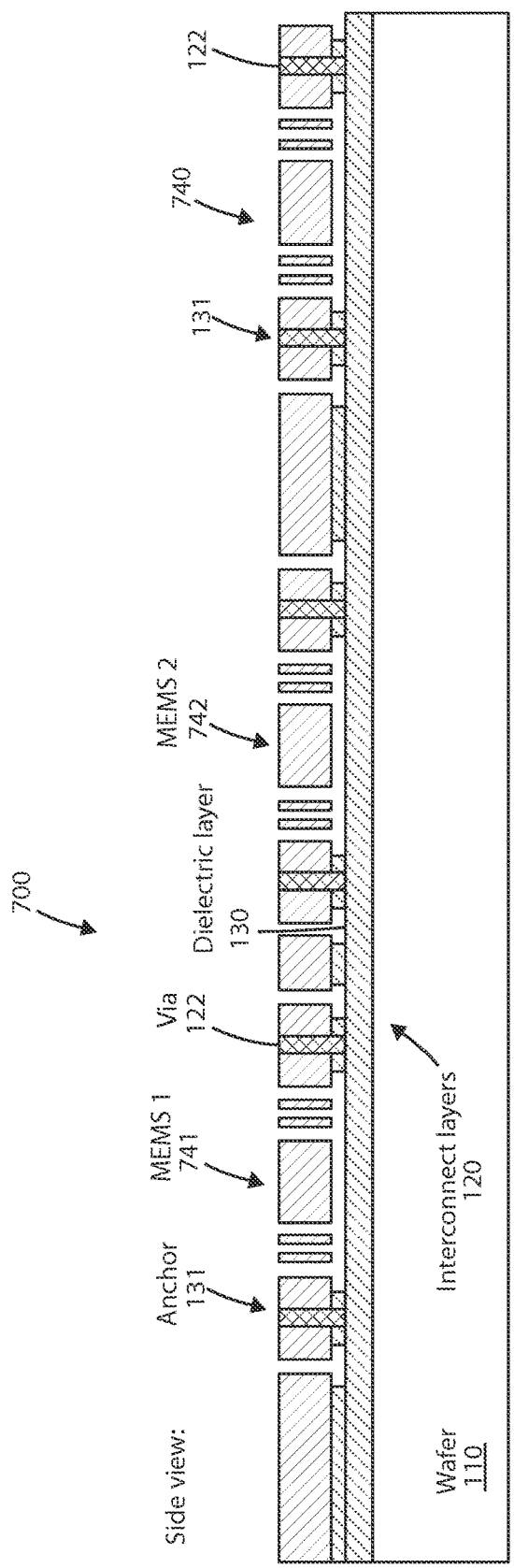
FIG. 7 illustrates a simplified cross-sectional diagram of a method step of providing a semiconductor substrate with MEMS devices according to an embodiment of the present invention.
Figure 8:
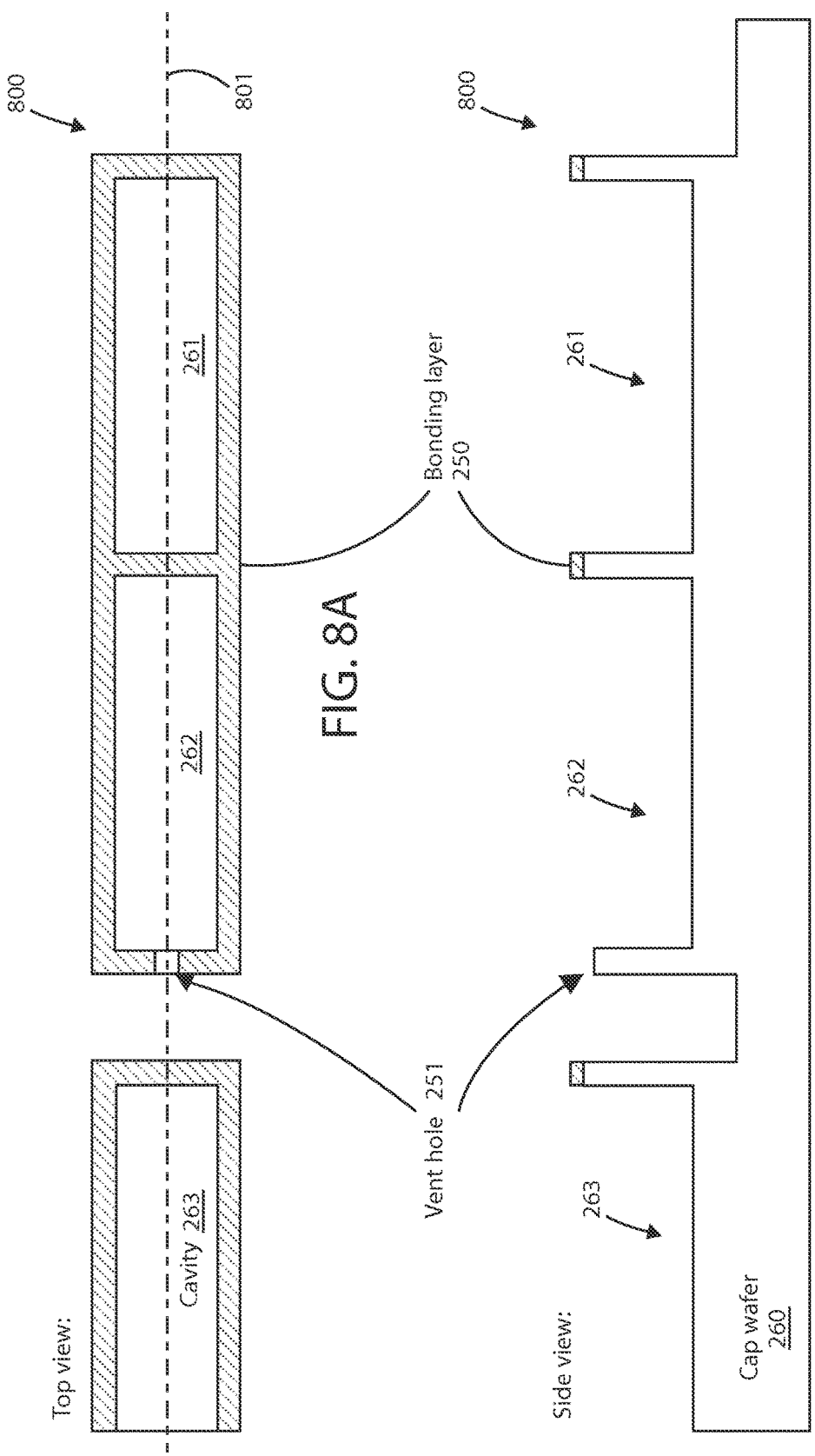
FIG. 8A illustrates a simplified top view diagram of a method step of providing an encapsulation wafer with cavities according to an embodiment of the present invention.
FIG. 8B illustrates a simplified cross-sectional diagram of a method step of providing an encapsulation wafer with cavities according to an embodiment of the present invention.

FIG. 6 illustrates a simplified cross-sectional diagram 600 of a method step of opening bond pads according to an embodiment of the present invention. In an embodiment, this method can be applied to the device shown in FIG. 5. If necessary, the thin film 570 can be partially etched to open bond pads for assembly processes, such as wafer-level chip probing or wire bonding.

In an embodiment, the present invention provides a method for fabricating a multiple MEMS device. This method can include a variety of steps, which can include those steps described in FIGS. 1-6. The method can include providing a semiconductor substrate having a first and second MEMS device and providing an encapsulation wafer comprising a first and second cavity, wherein the second cavity comprises at least one channel. The first and/or second MEMS device can be selected from a magnetometer, a gyroscope, an accelerometer, an oscillator, a filter, an infrared sensor, or the like.

The method can include providing a first encapsulation environment at a first air pressure, and encapsulating the first MEMS device within the first cavity and the second MEMS device within the second cavity, while within the first encapsulation environment, to encapsulate the first MEMS device within the first cavity at the first air pressure. In a specific embodiment, the first air pressure is below atmospheric air pressure, or in the case the first MEMS is an accelerometer, the first air pressure is above atmospheric pressure. The first air pressure can be below the second air pressure. The first encapsulation environment can include a gas selected from helium, xenon, krypton, argon, or the like.

Also, the method can include providing a second encapsulating environment at a second air pressure, wherein the second air pressure is different from the first air pressure, and subjecting the second MEMS device within the second cavity to the second encapsulation environment via the at least one channel.

The at least one channel can be sealed, while within the second encapsulation environment, to encapsulate the second MEMS device within the second cavity at the second air pressure. The sealing can include depositing a later of material using a process selected from CVD (Chemical Vapor Deposition), PVD (Plasma Vapor Deposition), sputtering, evaporation, or the like. Furthermore, one or more bond pads can be opened to be exposed through the sealing material.

In a specific embodiment, the method can further include providing an initial encapsulation wafer, patterning a masking layer on top of this wafer, and etching this wafer to form the encapsulation wafer. The masking layer can include a first, second, and third opening, wherein a width of the third opening is substantially smaller than a width of the first opening or the second opening. The etching can be done such that the first cavity is associated with the first opening, the second cavity is associated with the second opening, and the third opening is associated with the at least one channel.

In a specific embodiment, the depth of the at least one channel is less than a depth of the first cavity and a depth of the second cavity. The at least one channel can be provided within the device layer, the dielectric layer, or the interconnect layer. Examples of these embodiments are also shown in the following FIGS. 7-13. Those of ordinary skill in the art will recognize other variations, modifications, and alternatives.

Figure 9:
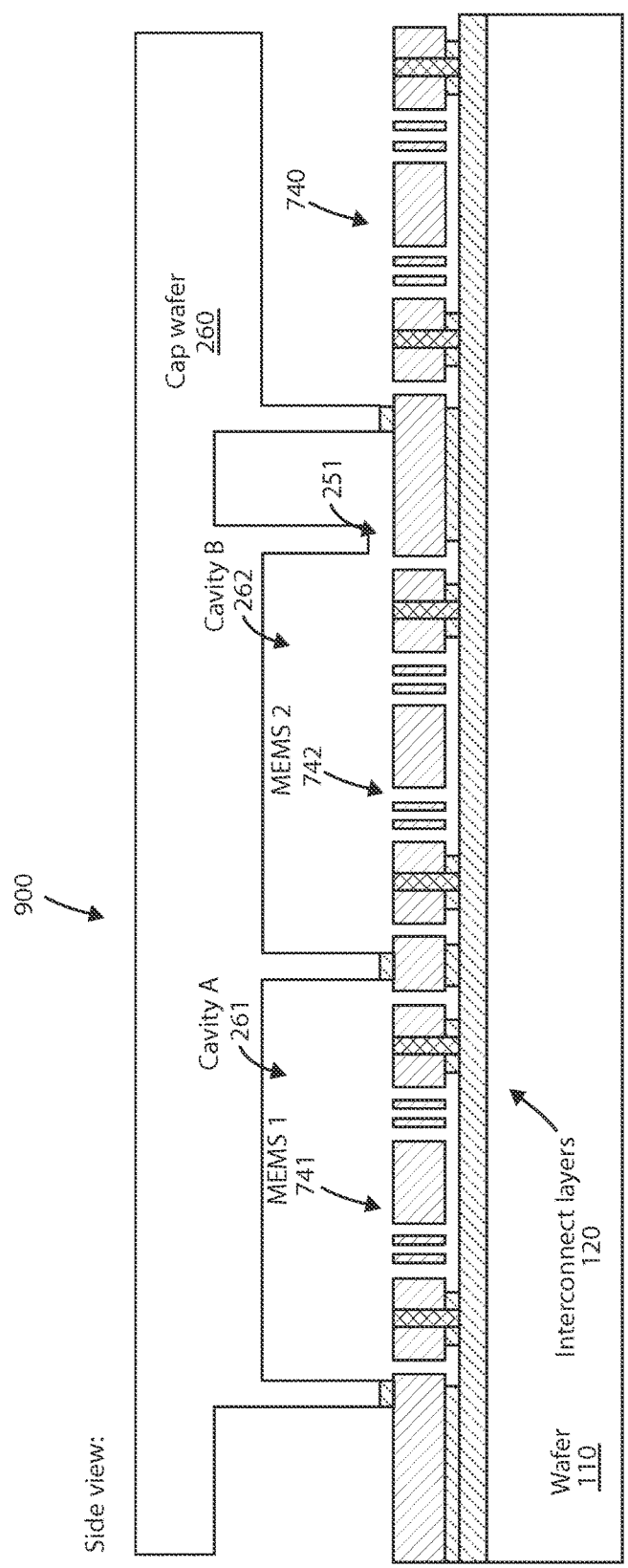
FIG. 9 illustrates a simplified cross-sectional diagram of a method step of encapsulating the MEMS devices within cavities by bonding the wafer cap to the device layer according to an embodiment of the present invention.
Figure 10:
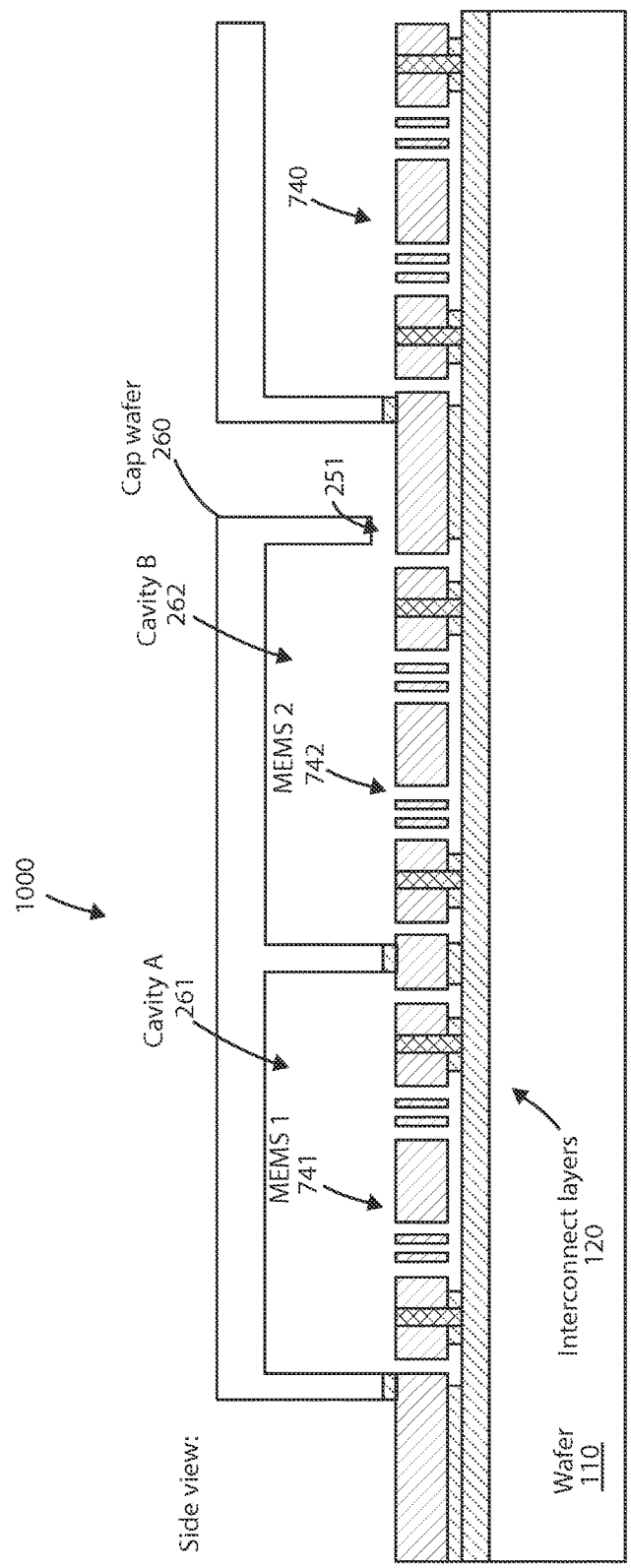
FIG. 10 illustrates a simplified cross-sectional diagram of a method step of etching the cap wafer to vent a cavity according to an embodiment of the present invention.
Figure 11:
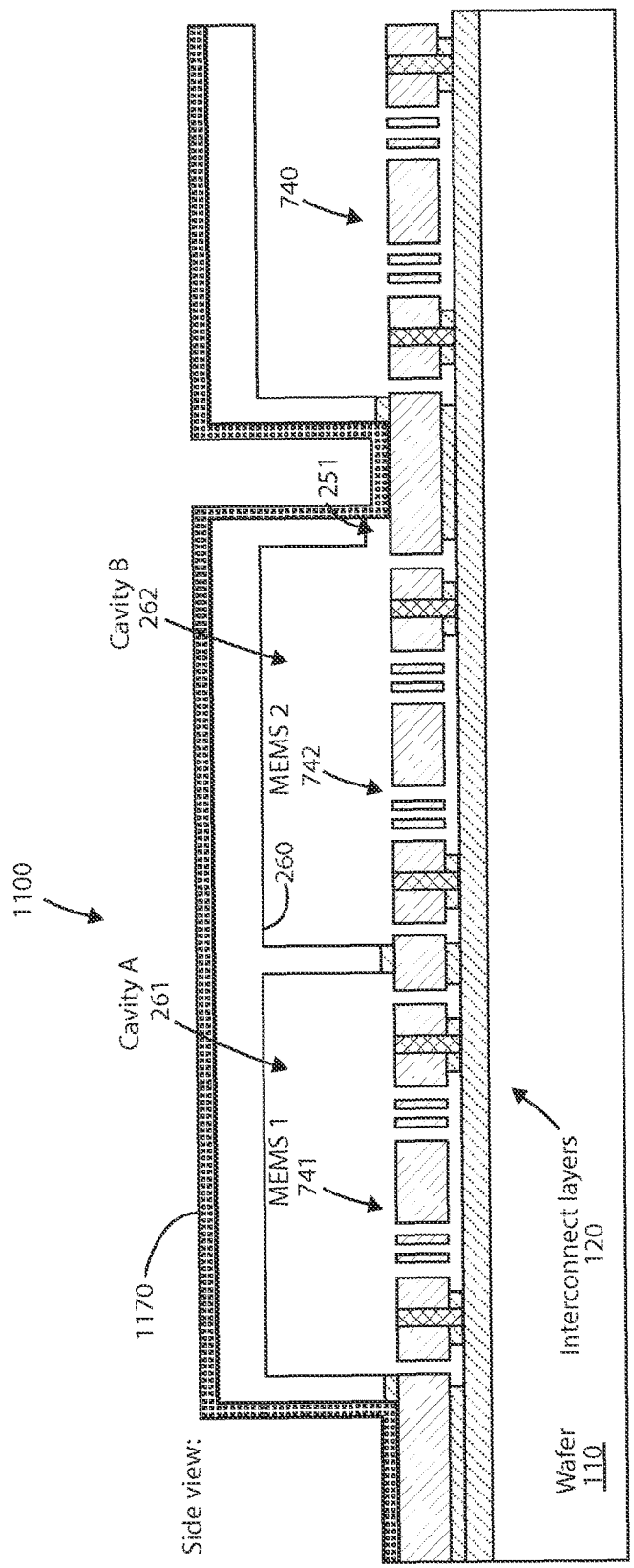
FIG. 11 illustrates a simplified cross-sectional diagram of a method step of depositing a thin film to seal a cavity according to an embodiment of the present invention.

FIGS. 7-11 illustrates simplified cross-sectional diagrams of a method step wherein the wafer cap is bonded to the device layer and the vent hole is created on the cap wafer according to another embodiment of the present invention. Diagram 700 shows a device similar to that shown in diagram 100 of FIG. 1, but having additional support structures in the MEMS layer. Top and cross-sectional diagrams 800 of FIGS. 8A and 8B show a substantially similar cap structure as in diagram 200 of FIGS. 2A and 2B. Diagram 900 of FIG. 9 shows the bonding of the cap wafer shown in diagram 800 to the device wafer shown in diagram 700. Furthermore, diagrams 1000 and 1100 of FIGS. 10 and 11 show the thinning of the cap wafer and the deposition of a thin film, respectively. These steps are similar to those shown in FIGS. 4 and 5 described previously. Various methods of forming a vent hole or channel are shown according to embodiments of the present invention.

Figure 12:
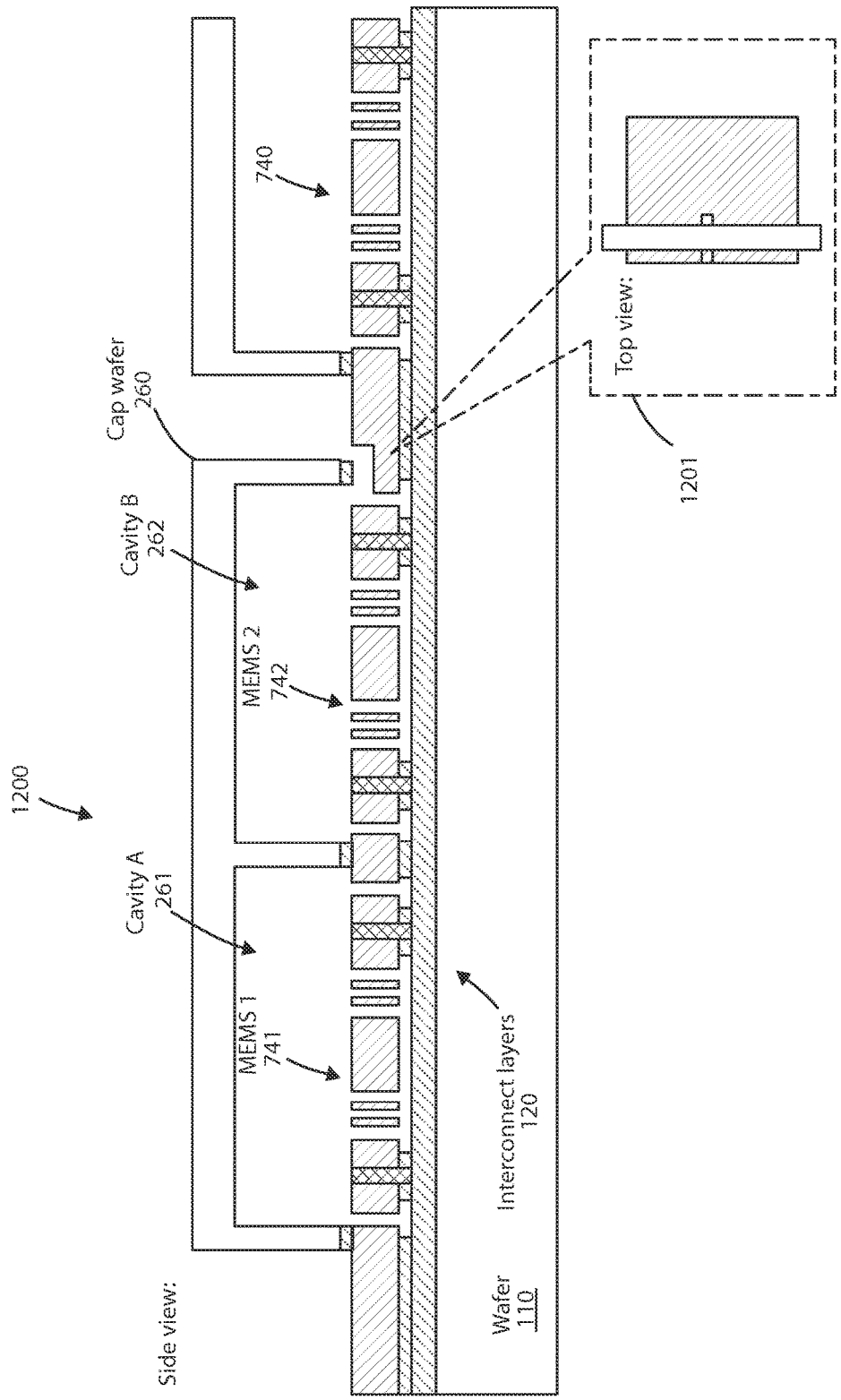
FIG. 12 illustrates a simplified cross-sectional diagram of a method step of creating a vent hole in the device layer according to an embodiment of the present invention.

FIG. 12 illustrates a simplified cross-sectional diagram 1200 of a method step wherein the vent hole is created on the device layer according to an embodiment of the present invention. Here, the vent hole is etched from a support structure in the MEMS layer, shown by the portion removed within a vicinity of the vent hole area shown in diagram 1000 of FIG. 10. As described in previous embodiments, the vent hole or channel will be sealed by thin film deposition or the like. The position of the vent hole within the device layer is also shown in a top view 1201 of the device.

Figure 13:
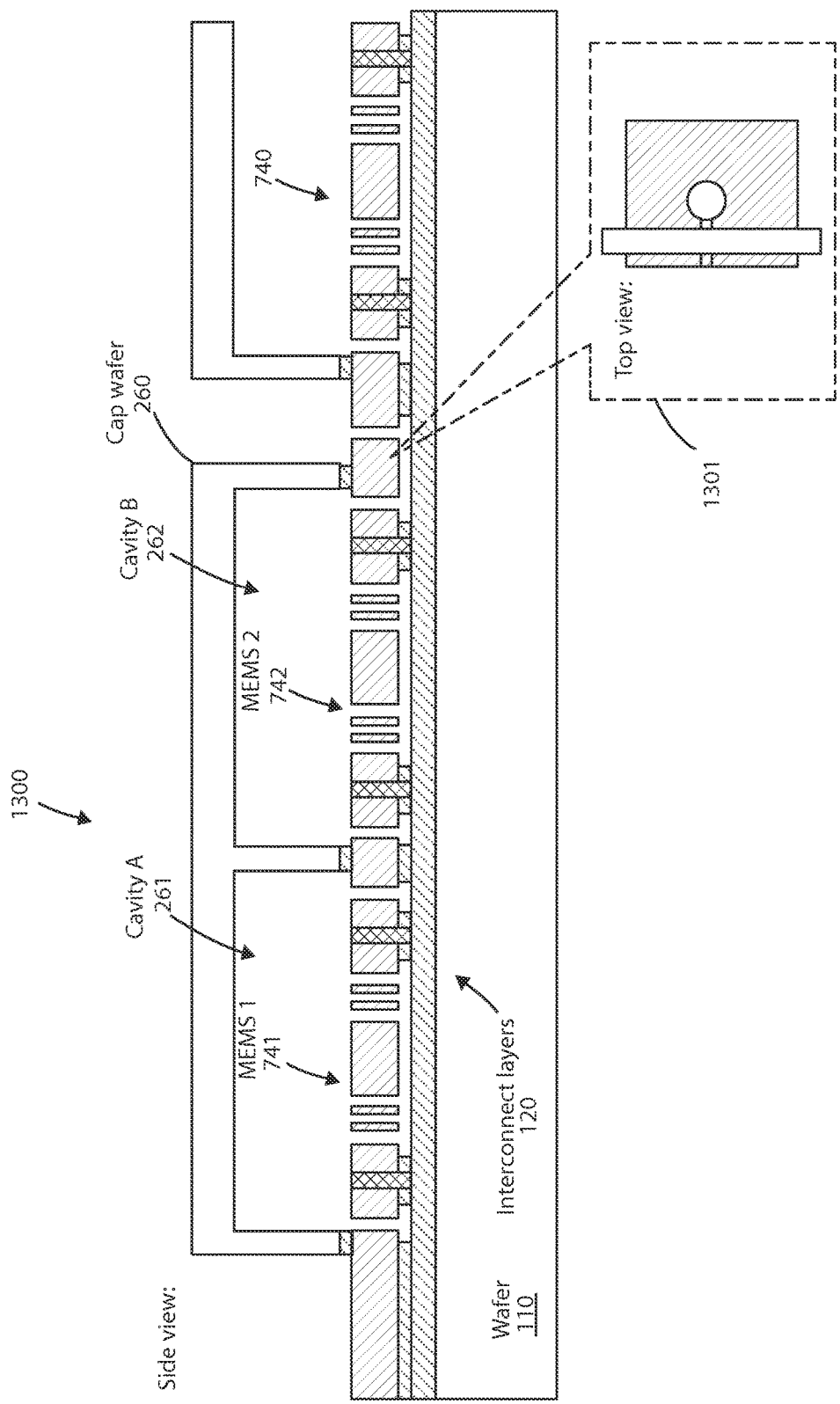
FIG. 13 illustrates a simplified cross-sectional diagram of a method step of creating a vent hole in the dielectric or interconnect layer according to an embodiment of the present invention.

FIG. 13 illustrates a simplified cross-sectional diagram 1300 of a method step wherein the vent hold is created in the dielectric or interconnect layer. Here, the vent hole path is etched through the dielectric or interconnect layer, shown by the path underlying the MEMS layer within a vicinity of where the vent hole was configured in diagram 1000 of FIG. 10. Again, the vent hole will be sealed by thin film deposition or the like. The position of the vent hole within the interconnect or dielectric layer is also shown in a top view 1301 of the device.

It is also understood that the examples and embodiments described herein are for illustrative purposes only and that various modifications or changes in light thereof will be suggested to persons skilled in the art and are to be included within the spirit and purview of this application and scope of the appended claims.

What is claimed is:

1. A method for fabricating a multiple MEMS (micro-electro-mechanical system) device comprising:
   providing a semiconductor substrate having a first MEMS device and a second MEMS device disposed on a dielectric layer;
   providing an encapsulation wafer comprising a first cavity and a second cavity;
   providing a first encapsulation environment at a first air pressure;
   while within the first encapsulation environment, bonding the encapsulation wafer directly to the dielectric layer to encapsulate the first MEMS device within the first cavity at the first air pressure;
   providing a second encapsulating environment at a second air pressure, wherein the second air pressure is different from the first air pressure;
   subjecting the second MEMS device within the second cavity to the second encapsulation environment via at least one channel; and
   sealing the at least one channel, while within the second encapsulation environment, to encapsulate the second MEMS device within the second cavity at the second air pressure.

2. The method of claim 1 wherein the at least one channel is provided within the device layer.

3. The method of claim 1 wherein the at least one channel is provided within the interconnect layer or dielectric layer.

4. The method of claim 1 wherein the first air pressure is below atmospheric air pressure and wherein the first MEMS device is selected from a group consisting of: a magnetometer, a gyroscope, an oscillator, a filter, an infrared sensor.

5. The method of claim 1 wherein the first air pressure is above atmospheric air pressure and wherein the first MEMS device is an accelerometer.

6. A method for fabricating a multiple MEMS device comprising:
   providing a semiconductor substrate having a MEMS layer including a first MEMS device, a second MEMS device, and a MEMS support structure, the semiconductor substrate having a device layer, an interconnect layer or dielectric layer, providing an encapsulation wafer comprising a first cavity, a second cavity, and a third cavity;
   providing a first encapsulation environment at a first air pressure;
   bonding the encapsulation wafer to the semiconductor substrate, while within the first encapsulation environment, to encapsulate the first MEMS device within the first cavity and to encapsulate the second MEMS device within the second cavity at the first air pressure, the second cavity and the third cavity being coupled through an access channel;

removing a top portion of the encapsulation wafer to expose the third cavity such that the second cavity is subject to air pressure in an outside environment through the access channel;

providing a second encapsulating environment at a second air pressure, wherein the second air pressure is different from the first air pressure;

subjecting the second MEMS device within the second cavity to the second encapsulation environment via the access channel; and sealing the access channel, while within the second encapsulation environment, to encapsulate the second MEMS device within the second cavity at the second air pressure.

7. The method of claim 6 wherein the first MEMS device is selected from a group consisting of: a magnetometer, a gyroscope, an oscillator, a filter, and an infrared sensor.

8. The method of claim 7 wherein the first air pressure is below atmospheric air pressure.

9. The method of claim 6 wherein the first MEMS device an accelerometer.

10. The method of claim 9 wherein the first air pressure is above atmospheric air pressure.

11. The method of claim 6 the first air pressure is below the second air pressure.

12. The method of claim 6 wherein the first encapsulation environment comprises a gas selected from a group consisting of: helium, xenon, krypton, argon.

13. The method of claim 6 wherein sealing the at least one channel comprises depositing a layer of material using a process selected from a group consisting of: CVD, PVD, sputtering, and evaporation.

14. The method of claim 6 further comprising:
providing an initial encapsulation wafer;
patterning a masking layer on top of the initial encapsulation wafer, wherein the masking layer comprises a first opening, a second opening, and a third opening, wherein a depth of the third opening is more than a depth of the first opening or a depth of the second opening;
etching the initial encapsulation wafer to form the encapsulation layer, wherein the first cavity is associated with the first opening, the second cavity is associated with the second opening, and the third opening is associated with the at least one channel.

15. The method of claim 14 wherein the depth of the at least one channel is less than a depth of the first cavity and less than a depth of the second cavity.

16. A method for fabricating a multiple MEMS device comprising:
providing a semiconductor substrate having a first MEMS device and a second MEMS device disposed on a dielectric layer;
providing an initial encapsulation wafer;
patterning a masking layer on top of the initial encapsulation wafer, wherein the masking layer comprises a first opening and a second opening;
etching the initial encapsulation wafer to form an encapsulation layer, wherein a first cavity is associated with the first opening, and a second cavity is associated with the second opening;
providing a first encapsulation environment at a first air pressure;
bonding the encapsulation wafer directly to the dielectric layer, while within the first encapsulation environment, the first cavity being sealed to encapsulate the first MEMS device within the first cavity at the first air pressure;
exposing the second cavity to an outside environment through an access channel at an interface between the encapsulation wafer and the dielectric layer;
providing a second encapsulating environment at a second air pressure, wherein the second air pressure is different from the first air pressure;
subjecting the second MEMS device within the second cavity to the second encapsulation environment via the channel; and
sealing the channel, while within the second encapsulation environment, to encapsulate the second MEMS device within the second cavity at the second air pressure.

17. The method of claim 16 further comprising opening one or more bond pads.

18. The method of claim 16 wherein the first air pressure is below atmospheric air pressure and wherein the first MEMS device is selected from a group consisting of: a magnetometer, a gyroscope, an oscillator, a filter, an infrared sensor.

19. The method of claim 16 wherein the first air pressure is above atmospheric air pressure and wherein the first MEMS device is an accelerometer.

20. The method of claim 16 wherein the depth of the access channel is less than a depth of the first cavity and less than a depth of the second cavity.

* * * * *